(12) United States Patent
Ohido et al.

(10) Patent No.: US 6,875,270 B2
(45) Date of Patent: Apr. 5, 2005

(54) MAGNETIC GARNET SINGLE-CRYSTAL FILM AND METHOD OF PRODUCING THE SAME, AND FARADAY ROTATOR COMPRISING THE SAME

(75) Inventors: Atsushi Ohido, Tokyo (JP); Kazuhito Yamasawa, Tokyo (JP)

(73) Assignee: TDK Corporation, Tokyo (JP)

( * ) Notice: Subject to any disclaimer, the term of this patent is extended or adjusted under 35 U.S.C. 154(b) by 744 days.

(21) Appl. No.: 09/779,467

(22) Filed: Feb. 9, 2001

(65) Prior Publication Data

US 2001/0023932 A1 Sep. 27, 2001

(30) Foreign Application Priority Data

Mar. 22, 2000 (JP) ........................................ 2000-081044

(51) Int. Cl.⁷ ............................................. C30B 19/02
(52) U.S. Cl. ............................. 117/54; 117/56; 117/63; 117/64; 117/946
(58) Field of Search ............................. 117/54, 56, 63, 117/64, 946

(56) References Cited

U.S. PATENT DOCUMENTS

| | | | |
|---|---|---|---|
| 4,818,080 A | * 4/1989 | Glasheen | 359/281 |
| 5,662,740 A | 9/1997 | Yamasawa et al. | |
| 5,683,506 A | * 11/1997 | Shirai et al. | 117/54 |
| 6,059,878 A | * 5/2000 | Takeda et al. | 117/56 |
| 6,411,641 B1 | * 6/2002 | Shirai et al. | 372/98 |
| 6,641,751 B1 | * 11/2003 | Ooido et al. | 252/62.57 |

FOREIGN PATENT DOCUMENTS

| | | |
|---|---|---|
| EP | 0 368 483 A2 | 5/1990 |
| JP | 4-139093 | 5/1992 |
| JP | A 5-173102 | 7/1993 |
| JP | 6-92796 | 4/1994 |
| JP | 2000-86396 | * 3/2000 |

OTHER PUBLICATIONS

Ferrand et al. "Growth by LPE of ND: YAG single crystal layers for waveguide laser applications." *Journal of Crystal Growth*. Proc. 10$^{th}$ Int. Conf. On Crystal Growth '92 Mar. 1993 I, Pt. 2, No. ¼, Amsterdam, NL.

Nakajima et al. A New Improved $(YbTbBi)_3Fe_5O_{12}$ Epitaxial Thick Film, 8108 I. E. E. E. Trans. On Magnetics 24 (1988) Nov. No. 6, New York, NY, US.

* cited by examiner

*Primary Examiner*—Robert Kunemund
(74) *Attorney, Agent, or Firm*—Oliff & Berridge, PLC

(57) ABSTRACT

The invention relates to a Bi-substituted rare earth-iron garnet single-crystal film and a method for producing it, and also to a Faraday rotator comprising it. Its object is to provide a magnetic garnet single-crystal film which hardly cracks while it grows or is cooled or polished and worked, and to provide a method for producing it. Its object is also to provide a Faraday rotator produced at high yield by working the magnetic garnet single-crystal film which hardly cracks while it grows or is cooled or polished and worked. In a method for producing a magnetic garnet single-crystal film by growing a Bi-substituted magnetic garnet single crystal in a mode of liquid-phase epitaxial growth, the lattice constant of the growing magnetic garnet single crystal is so controlled that it does not vary or gradually decreases with the growth of the single-crystal film, and then increases with it.

6 Claims, 5 Drawing Sheets

MAGNETIC GARNET SINGLE-CRYSTAL FILM AND METHOD OF PRODUCING THE SAME, AND FARADAY ROTATOR COMPRISING THE SAME

BACKGROUND OF THE INVENTION

1. Field of the Invention

The present invention relates to a magnetic garnet single-crystal film (Bi(bismuth)-substituted rare earth-iron garnet single-crystal film) and a method of producing the film, and to a Faraday rotator comprising the film.

2. Description of the Related Art

Bi-substituted magnetic garnet single-crystal films for Faraday rotators such as optical isolators, optical circulators and others of ten crack while they grow in a mode of liquid-phase epitaxial growth on a substrate or while they are polished and worked into such Faraday rotators, and are therefore problematic in that the yield in working them into Faraday rotators is extremely low. To solve the problem, for example, a method is disclosed in Japanese Patent Laid-Open No. 139093/1992(hereinafter referred to as Reference 1), in which a liquid-phase epitaxial film is grown on a substrate in such a controlled manner that the lattice constant of the growing film may be the same as that of the substrate at room temperature to thereby prevent the film from cracking. Another method is disclosed in Japanese Patent Laid-Open No. 92796/1994 (hereinafter referred to as Reference 2), in which the liquid-phase epitaxial growth of film is so controlled that the lattice constant of the growing film is gradually increased in the direction of the film growth from the film-substrate interface to thereby prevent the film from cracking.

Bi-substituted magnetic garnet single-crystal films formed in a liquid-phase epitaxial growth process often crack while they grow at a temperature between 700 and 1000° C., or while the thus-grown films are cooled, or while they are polished to be worked into Faraday rotators. The reason is because of the difference in the thermal expansion coefficient between the films and the gadolinium-gallium-garnet ($Gd_3Ga_5O_{12}$)-type single-crystal substrates (hereinafter referred to as CaMgZr-substituted GGG single-crystal substrates) for them.

After having grown on the substrate, the Bi-substituted magnetic garnet single-crystal film is polished and worked at room temperature into Faraday rotators. In order to prevent the single-crystal film from cracking while it is worked so, the film must be so controlled that its lattice constant around the interface between the film and the underlying substrate may be nearly the same as that of the substrate. However, the thermal expansion coefficient of the Bi-substituted magnetic garnet film is larger by around 20 to 30% than that of the substrate. Therefore, when the single-crystal film is so controlled that its lattice constant around the interface between the film and the substrate may be the same as that of the substrate at room temperature, then the lattice constant of the film shall be larger than that of the substrate at a temperature of from 700 to 1000° C. at which the film grows on the substrate. As a result, while growing at such a temperature, the substrate and the single-crystal film on the substrate will warp to have a convexedly curved profile to the film side.

In case where the single-crystal film is grown on a substrate in such a controlled manner that the lattice constant of the film may be the same as that of the substrate at room temperature and that the lattice constant of the overall structure may have a predetermined value, as in Reference 1, the growing film warps more to have a more convexedly curved profile while growing more to have an increased thickness, and warps most when the thickness of the growing film has reached nearly a half of the thickness of the substrate. After having grown further more so that its thickness is over nearly a half of the thickness of the substrate, the film does not warp any more, but its surface cracks to have concentric circular cracks. As a result, the yield in working the film into Faraday rotators is low.

In case where the single-crystal film is grown on a crystal substrate of which the thickness is at least about 2 times the necessary thickness (thickness of Faraday rotator+depth of film to be ground away) of the film to be worked into Faraday rotators, it is prevented from being damaged to have concentric circular cracks. However, if the crystal substrate is thick, the single-crystal film growing or having grown on it often cracks in the substrate-film interface while the film grows or while the grown film is cooled, depending on the condition under which the film is grown and on the varying lattice constant of the substrate that may cause a minor difference between the lattice constant of the substrate and that of the film in the substrate-film interface. This causes the reduction in the yield in working the film into Faraday rotators.

Therefore, as proposed in Reference 1, while the growth of single-crystal film is attempted on a substrate in such a controlled manner that the lattice constant of the single-crystal film may be the same as that of the crystal substrate at room temperature and further that the lattice constant of the overall structure may have a predetermined value, the concentric circular cracks are formed on the surface in the condition that the crystal substrate is relatively short in thickness, and other cracks are formed on the substrate-film interface in the condition that the crystal substrate is relatively long in thickness. As a result, it is difficult to avoid the problem of low yield in working the film into Faraday rotators.

In the method described in Reference 2, the lattice constant of the single-crystal film growing on a substrate is gradually increased with the increase in the thickness of the growing film to thereby prevent the film surface from cracking to have concentric circular cracks. If, in the substrate-film interface, the lattice constant of the single-crystal film is controlled to be the same as that of crystal substrate at room temperature, the substrate with the film growing thereon will warp to have a convexedly curved profile at the temperature at which the film is growing thereon. Therefore, the lattice constant of the single crystal of the film is increased with the increase in the thickness of the growing single-crystal film so that the growing film may have a convexedly curved profile in accordance with the warped profile of the substrate.

In that manner, the problem of concentric circular cracks of the single-crystal film growing on a thin substrate in the method described in Reference 1 can be solved. In addition, when the single-crystal film is grown on a thin substrate in the method of Reference 2, it is free from the problem of cracking in the substrate-film interface that may occur when the film is grown on a thick substrate. Accordingly, as compared with the method of Reference 1, the method of Reference 2 is effective for preventing film cracking in the step of growing and cooling the single-crystal film.

However, if the single-crystal film is prevented from cracking according to the operation as above, the film formed shall have a convex profile, and will be still kept convexedly warped even after cooled to room temperature. Regarding its profile, the crystal substrate is in the form of a flat disc. Therefore, if a convexedly-warped, magnetic garnet single-crystal film is epitaxially grown on the crystal substrate, the interface between the substrate and the film involves intrinsic stress, and the film will be convexedly warped in some degree at room temperature. Accordingly, while polished and worked, the single-crystal film will be cracked owing to the intrinsic stress. As a result, the yield in working the film into Faraday rotators is low.

SUMMARY OF THE INVENTION

One object of the present invention is to provide a magnetic garnet single-crystal film which hardly cracks while the film grows or is cooled or polished and worked, and to provide a method for producing the film.

Another object of the invention is to provide a Faraday rotator produced at high yield by working the magnetic garnet single-crystal film which hardly cracks while the film grows or is cooled or polished and worked.

The object is attained by a magnetic garnet single-crystal film which is so formed that its lattice constant does not vary or gradually decreases, and then increases in the direction in which the film grows.

The object is also attained by a method for producing a magnetic garnet single-crystal film by growing a Bi-substituted magnetic garnet single crystal in a mode of liquid-phase epitaxial growth, wherein the lattice constant of the growing magnetic garnet single crystal is so controlled that the lattice constant does not vary or gradually decreases with the growth of the single-crystal film, and then increases with the growth of the single-crystal film.

The object is also attained by a Faraday rotator produced by working a magnetic garnet single-crystal film formed in a mode of liquid-phase epitaxial growth, wherein the lattice constant A of the light-receiving surface of the magnetic garnet single-crystal film, the lattice constant B of the light-emitting surface thereof, and the lattice constant C of the region of the magnetic garnet single-crystal film spaced by nearly the same distance both from the light-receiving surface of the film and from the light-emitting surface thereof satisfy the requirement, $(A+B)/2>C$.

In the invention, the Bi-substituted rare earth-iron garnet single-crystal film is grown in a mode of liquid-phase epitaxial growth in such a controlled manner that its lattice constant is kept as it is or is gradually decreased for a predetermined period of time from the start of the liquid-phase epitaxial growth of the film. Then, with the increase of the thickness of the growing film, the lattice constant of the film is increased in accordance with the increased thickness of the film. Accordingly, in this method, the single-crystal film formed is prevented from cracking while the film grows or is cooled and while the film is polished and worked, and the yield in working the film into Faraday rotators is thereby increased.

DESCRIPTION OF THE PREFERRED EMBODIMENTS OF THE INVENTION

Figure 1:
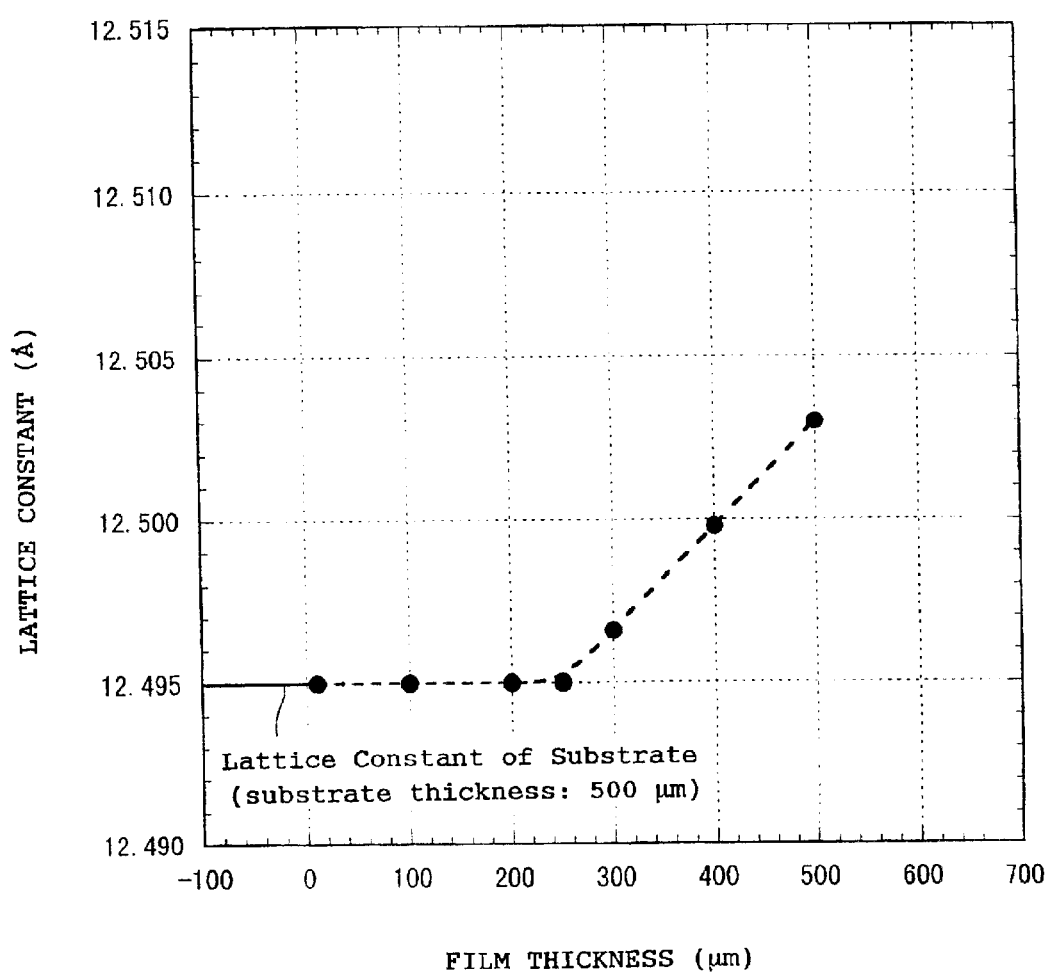
FIG. 1 is a graph showing the relationship between the lattice constant of the single-crystal film and the thickness thereof in Example 1 that demonstrates one embodiment of the invention.
Figure 2:
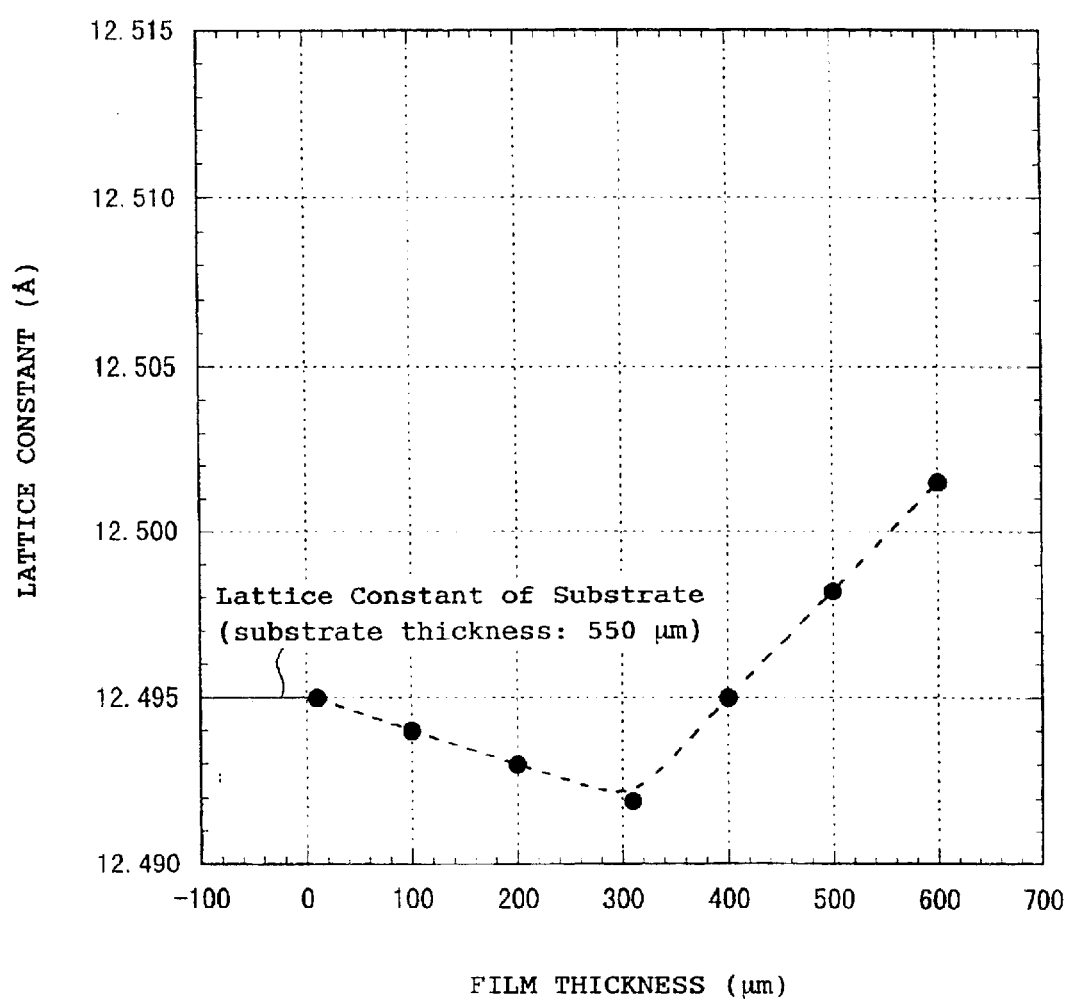
FIG. 2 is a graph showing the relationship between the lattice constant of the single-crystal film and the thickness thereof in Example 2 that demonstrates one embodiment of the invention.
Figure 3:
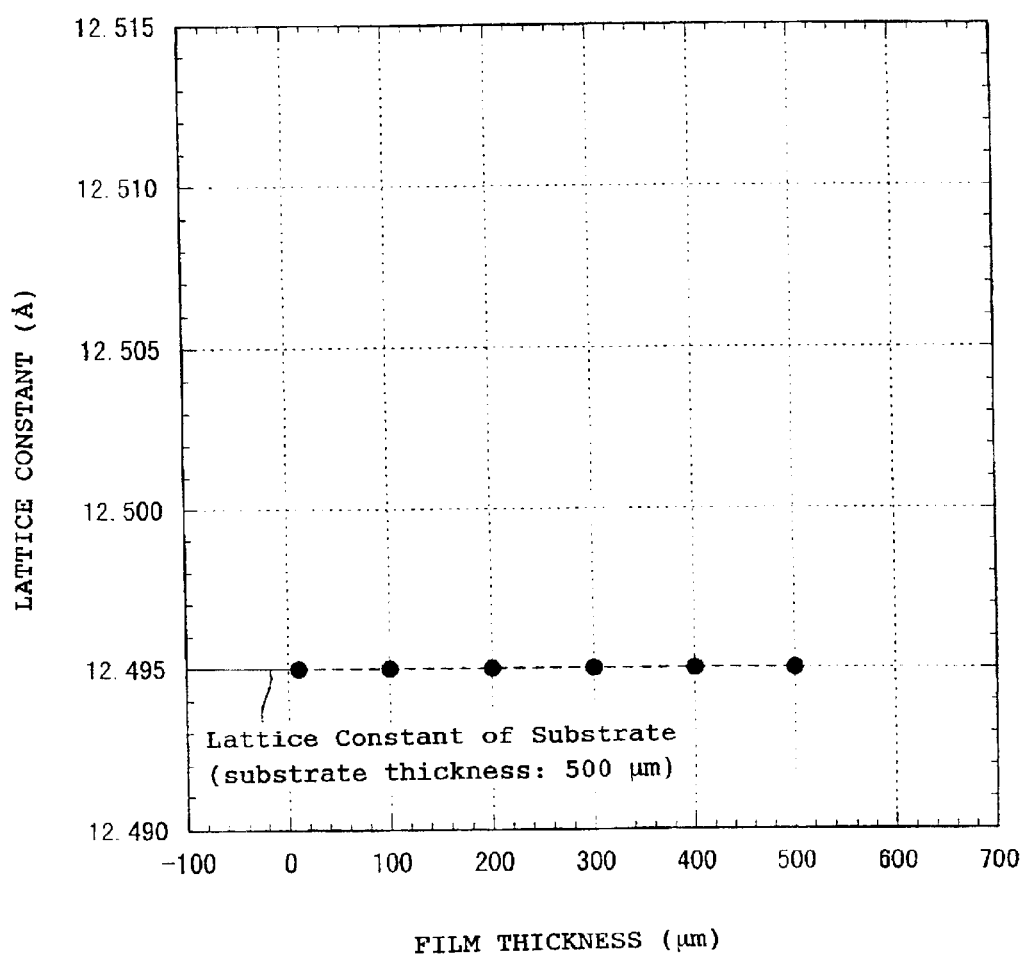
FIG. 3 is a graph showing the relationship between the lattice constant of the single-crystal film and the thickness thereof in Comparative Example 1 that is compared with one embodiment of the invention.
Figure 4:
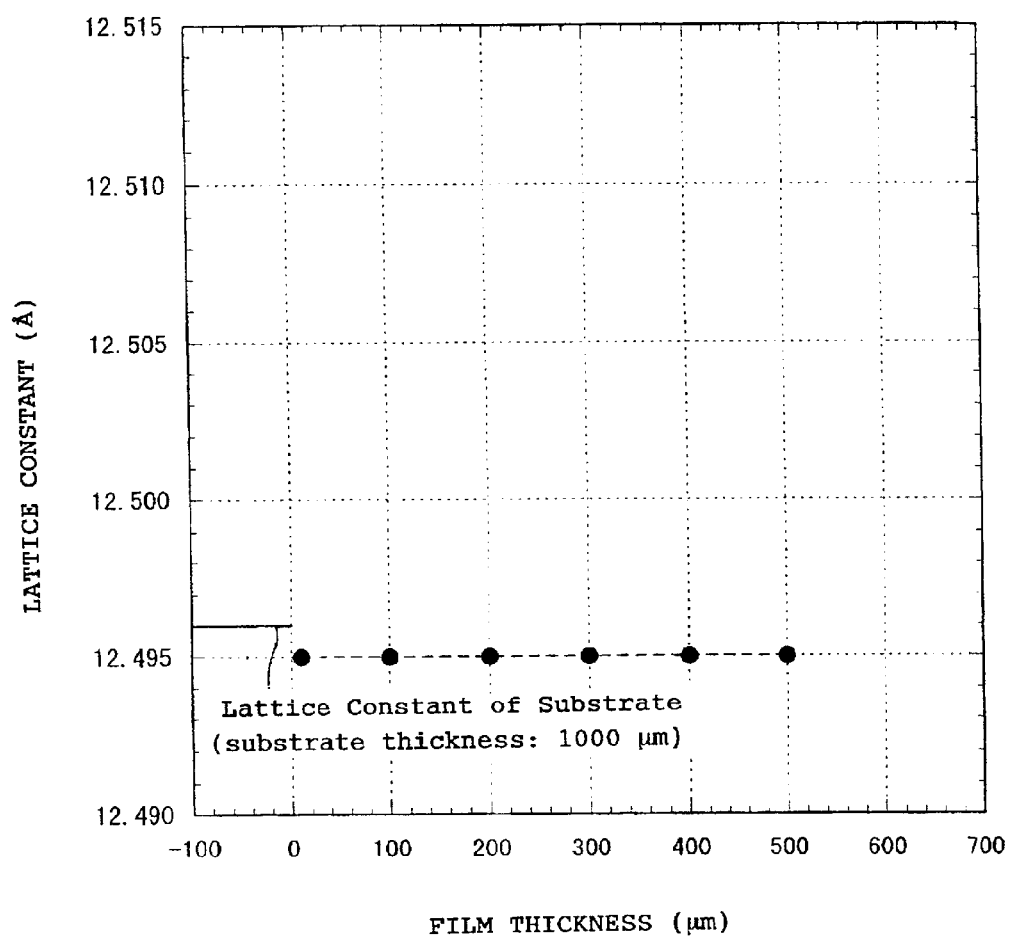
FIG. 4 is a graph showing the relationship between the lattice constant of the single-crystal film and the thickness thereof in Comparative Example 2 that is compared with one embodiment of the invention.
Figure 5:
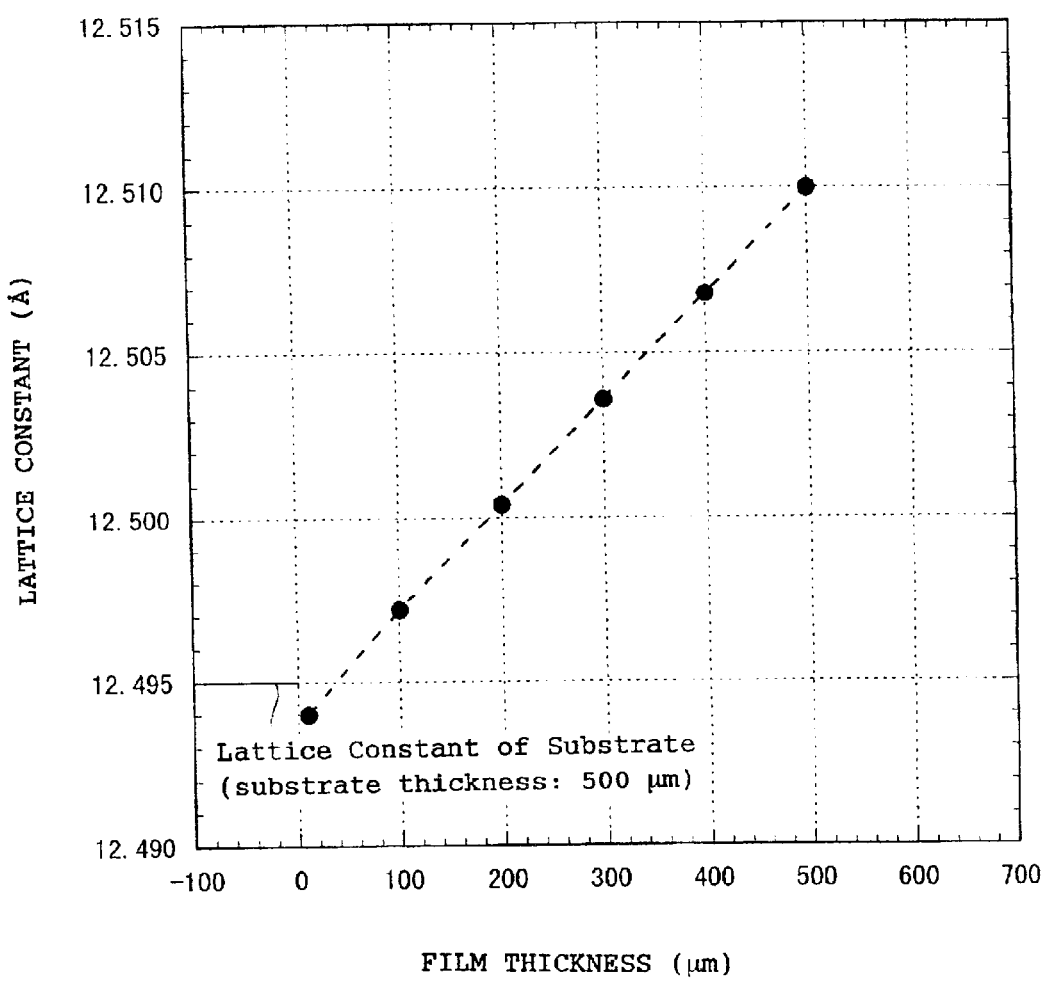
FIG. 5 is a graph showing the relationship between the lattice constant of the single-crystal film and the thickness thereof in Comparative Example 3 that is compared with one embodiment of the invention.

One embodiment of the invention that provides a magnetic garnet single-crystal film and a method for producing the film and provides a Faraday rotator comprising the film is described with reference to FIG. 1 to FIG. 5.

We, the present inventors have studied how to control the lattice constant of magnetic garnet single-crystal films in the direction in which the films grow, for the purpose of preventing the films from cracking while they grow or are cooled and while they are polished and worked. As a result, we have found that, when the single-crystal film is grown in such a controlled manner that its lattice constant is kept at it is or is gradually decreased for a predetermined period of time from the start of the growth of the film, and then the lattice constant is increased along with the growth of the film, then the method is significantly effective for preventing the film from cracking while it grows or is cooled and while it is polished and worked.

Specifically, when a Bi-substituted rare earth-iron garnet single crystal is grown on a CaMgZr-substituted GGG single-crystal substrate having a thickness of t, its growth is so controlled that the lattice constant of the growing single-crystal film may be the same as that of the substrate at room temperature or may gradually decrease within a period of time after the film has started to grow and before its thickness reaches about t/2. After that, the film is so grown that its lattice constant may increase with the increase in the film thickness to about t/2 and more. In the controlled manner, the surface of the growing film is prevented from cracking to have concentric circular cracks; and the grown film does not crack while cooled or while polished and worked.

When the Bi-substituted rare earth-iron garnet single-crystal film is epitaxially grown on a substrate in such a manner that its lattice constant may be the same as that of the substrate in the substrate-film interface at room temperature, the lattice constant of the growing film will be larger than that of the substrate since the thermal expansion coefficient of the film is larger than that of the substrate. Therefore, in this condition, if the single-crystal film is so grown that the lattice constant of all the growing film is all the time kept as it is, the substrate and the film growing thereon will be so deformed that the film and the substrate have a convexedly warped profile to the film side before the film thickness reaches a half of the substrate thickness, and in this stage, the film surface receives compressive stress.

With that, when the film further grows to have an increased thickness larger than a half of the thickness of the substrate, then the surface of the growing film will receive tensile stress, and the tensile stress increases with the increase in the thickness of the film. If the film surface receives such tensile stress while the film is growing, the interatomic bonds constituting the film will be broken, and, as a result, the film surface will crack to have concentric circular cracks owing to the stress distribution therein.

The operation for increasing the lattice constant of the growing film is effective for preventing the tensile stress that may happen to the film at a time at which the thickness of the film reaches about a half of the thickness of the substrate. However, when the thickness of the film is still smaller than a half of the thickness of the substrate, the film receives compressive stress. In this condition, therefore, the film does not crack to have concentric circular cracks even when its lattice constant is kept as it is or is gradually decreased. Therefore, while the thickness of the film is still smaller than about a half of the thickness of the substrate, the lattice constant of the film is kept as it is or is gradually decreased; and after it has reached about a half or more of the thickness of the substrate, the lattice constant of the film is increased, whereby the growing film is prevented from cracking to have concentric circular cracks. As compared with the condition under which the lattice constant of the growing film is all the time increased, the controlled condition as herein is further advantageous in that the degree of concaved deformation to the film side of the single-crystal film formed on the crystal substrate in that controlled condition is small, and therefore the grown film is prevented from cracking while the film is cooled or while the film is polished and worked.

According to the method described hereinabove, the single-crystal film can be grown to have a thickness larger than the thickness of the substrate without being cracked to have concentric circular cracks. Therefore, in this method, the thickness of the crystal substrate on which the single-crystal film is to grow may be reduced. The substrate, if thick, and the film formed thereon are hardly deformed, and will therefore involve stress intrinsic thereto owing to the minor difference between the lattice constant of the substrate and that of the film at room temperature that may be caused by the varying film-growing condition. If so, the substrate and the film formed thereon will crack at the interface therebetween. However, if the substrate is thin, the stress owing to the difference between the lattice constant of the substrate and that of the film at the substrate-film interface may be relaxed by the deformed substrate and the film formed thereon, and, as a result, the substrate-film interface does not crack.

Accordingly, if a thinner substrate is used, and if the single-crystal film is formed thereon in such a controlled condition that the lattice constant of the growing film is kept as it is or is gradually decreased within a predetermined period of time from the start of the epitaxial growth of the film to the growth of the film not as yet having concentric circular cracks, and after that period of time, the film is further grown to have an increased thickness with its lattice constant being increased, then the growing film is prevented from cracking and the grown film is also prevented from cracking while the film is cooled or while the film is polished and worked. Accordingly, the yield in working the film into Faraday rotators can be noticeably increased.

As described hereinabove, the magnetic garnet single-crystal film formed in such a controlled manner that its lattice constant is kept as it is or is gradually decreased and then increased in the direction in which the film has grown is worked into Faraday rotators. When the Faraday rotator thus produced contains the region of the magnetic garnet single-crystal film of which the lattice constant increases therein, then the mean value of the lattice constant of the light-receiving surface of the Faraday rotator and that of the light-emitting surface thereof may be larger than the lattice constant of the inside region of the magnetic garnet single-crystal film that is spaced by nearly the same distance from both the surfaces. Accordingly, in the Faraday rotator, the lattice constant A of the light-receiving surface of the magnetic garnet single-crystal film, the lattice constant B of the light-emitting surface thereof, and the lattice constant C of the region of the magnetic garnet single-crystal film spaced by nearly the same distance both from the light-receiving surface of the film and from the light-emitting surface thereof satisfy the requirement, $(A+B)/2>C$.

Specific examples of the magnetic garnet single-crystal film, the method for producing the film and the Faraday rotator comprising the film of this embodiment of the invention are described with reference to Example 1, Example 2 and Comparative Examples 1 to 3 and to FIG. 1 to FIG. 5.

EXAMPLES

Example 1

6.747 g of $Yb_2O_3$, 6.624 g of $Gd_2O_3$, 43.214 g of $B_2O_3$, 144.84 g of $Fe_2O_3$, 1189.6 g of PbO, 826.4 g of $Bi_2O_3$, and 2.360 g of $GeO_2$ were metered and put into a Pt crucible, melted and homogenized therein with stirring at about 1000° C., and then cooled at a cooling rate of 120° C./hr. Being supersaturated, the resulting melt was stabilized at 820° C. With a CaMgZr-substituted GGG single-crystal substrate of 2 inches φ in size (thickness: 500 μm) being rotated at 100 rpm, a magnetic garnet single-crystal film of the melt was grown in a mode of epitaxial growth on one surface of the substrate for 15 hours, while being cooled at a cooling rate of 0.30° C./hr. Next, the single-crystal film was further grown thereon for 20 hours, while being cooled at a cooling rate of 0.80° C./hr.

As a result, the single-crystal film thus formed on the substrate had a thickness of 525 μm. The magnetic garnet single-crystal film had a mirror surface with no cracks found thereon. The single-crystal film around the substrate-film interface was analyzed through fluorescent X-ray spectrometry, and its composition was $Bi_{1.12}Gd_{1.15}Yb_{0.69}Pb_{0.04}Fe_{4.96}Pt_{0.01}Ge_{0.03}O_{12}$.

The magnetic garnet single-crystal film was polished and worked to have a Faraday rotation angle of 45 degrees to a ray having a wavelength of 1.55 μm, and its both surfaces were coated with a non-reflective film to finish a Faraday rotator for a wavelength of 1.55 μm. The Faraday rotator was cut to have a size of 3 mm×3 mm, and was evaluated for its Faraday rotation power, insertion loss, temperature dependency and quenching coefficient. The single-crystal film thickness of the Faraday rotator was 400 μm; the Faraday rotation coefficient thereof was 0.113 deg/μm; the insertion loss thereof was at most 0.05 dB and at least 0.01 dB; the temperature dependency thereof was 0.067 deg/° C.; and the quenching coefficient thereof was at most 45.1 dB and at least 42.0 dB.

The surface of the single-crystal film was polished repeatedly and the lattice constant of the polished surface of the film was measured through X-ray diffractometry (Bond's method) after every polishing operation. From the data, obtained was the relationship between the lattice constant of the single-crystal film and the thickness of the film in its growth direction (see FIG. 1). The lattice constant was obtained from the diffraction line on the face (888). As a result, on the substrate having a lattice constant of 12.495 Å, the single-crystal film formed kept having a lattice constant of 12.495 Å before its thickness reached 250 μm, and its lattice constant increased with the increase in its thickness; and when its thickness reached 500 μm, the film had a lattice constant of 12.503 Å, as in FIG. 1.

When the film formed in the process as herein was worked into Faraday rotators, the production yield was about 85%.

Example 2

14.110 g of Tb$_2$O$_3$, 46.45 g of B$_2$O$_3$, 148.82 g of Fe$_2$O$_3$, 1054.4 g of PbO, 965.8 g of Bi$_2$O$_3$, and 2.522 g of GeO$_2$ were metered and put into a Pt crucible, melted and homogenized therein with stirring at about 1000° C., and then cooled at a cooling rate of 120° C./hr. Being supersaturated, the resulting melt was stabilized at 833° C. With a CaMgZr-substituted GGG single-crystal substrate of 2 inches φ in size (thickness: 550 μm) being rotated at 100 rpm, a magnetic garnet single-crystal film of the melt was grown in a mode of epitaxial growth on one surface of the substrate for 15 hours, while being cooled at a cooling rate of 0.25° C./hr. Next, the single-crystal film was further grown thereon for 27 hours, while being cooled at a cooling rate of 0.85° C./hr.

As a result, the single-crystal film thus formed on the substrate had a thickness of 620 μm. The magnetic garnet single-crystal film had a mirror surface with no cracks found thereon. The single-crystal film around the substrate-film interface was analyzed through fluorescent X-ray spectrometry, and its composition was Bi$_{0.80}$Tb$_{2.16}$Pb$_{0.04}$Fe$_{4.96}$Pt$_{0.01}$Ge$_{0.03}$O$_{12}$.

The magnetic garnet single-crystal film was polished and worked to have a Faraday rotation angle of 45 degrees to a ray having a wavelength of 1.55 μm, and its both surfaces were coated with a non-reflective film to finish a Faraday rotator for a wavelength of 1.55 μm. The Faraday rotator was cut to have a size of 3 mm×3 mm, and was evaluated for its Faraday rotation power, insertion loss, temperature dependency and quenching coefficient. The single-crystal film thickness of the Faraday rotator was 505 μm; the Faraday rotation coefficient thereof was 0.089 deg/μm; the insertion loss thereof was at most 0.10 dB and at least 0.08 dB; the temperature dependency thereof was 0.040 deg/° C.; and the quenching coefficient thereof was at most 46.1 dB and at least 42.3 dB.

The surface of the single-crystal film was polished repeatedly and the lattice constant of the polished surface of the film was measured through X-ray diffractometry (Bond's method) after every polishing operation. From the data, obtained was the relationship between the lattice constant of the single-crystal film and the thickness of the film in its growth direction (see FIG. 2). The lattice constant was obtained from the diffraction line on the face (888). As a result, on the substrate having a lattice constant of 12.495 Å, the single-crystal film formed kept having a lattice constant of 12.495 Å before its thickness reached 10 μm; and then its lattice constant gradually decreased with the increase in its thickness, from 12.495 Å (film thickness: 10 μm) to 12.492 Å (film thickness: 310 μm), and thereafter increased with further increase in the film thickness; and when its thickness reached 600 μm, the film had a lattice constant of 12.502 Å, as in FIG. 2.

When the film formed in the process as herein was worked into Faraday rotators, the production yield was about 80%.

Comparative Example 1

6.747 g of Yb$_2$O$_3$, 6.624 g of Gd$_2$O$_3$, 43.214 g of B$_2$O$_3$, 144.84 g of Fe$_2$O$_3$, 1189.6 g of PbO, 826.4 g of Bi$_2$O$_3$, and 2.360 g of GeO$_2$ were metered and put into a Pt crucible, melted and homogenized therein with stirring at about 1000° C., and then cooled at a cooling rate of 120° C./hr. Being supersaturated, the resulting melt was stabilized at 820° C. With a CaMgZr-substituted GGG single-crystal substrate of 2 inches φ in size (thickness: 500 μm) being rotated at 100 rpm, a magnetic garnet single-crystal film of the melt was grown in a mode of epitaxial growth on one surface of the substrate for 35 hours, while being cooled at a cooling rate of 0.30° C./hr.

As a result, the single-crystal film thus formed on the substrate had a thickness of 505 μm. The surface of the magnetic garnet single-crystal film cracked and had concentric circular cracks entirely thereon, and the periphery of the film was partly peeled from the substrate as it cracked. The single-crystal film around the substrate-film interface was analyzed through fluorescent X-ray spectrometry, and its composition was Bi$_{1.12}$Gd$_{1.15}$Yb$_{0.69}$Pb$_{0.04}$Fe$_{4.96}$Pt$_{0.01}$Ge$_{0.03}$O$_{12}$.

Working the magnetic garnet single-crystal film was tried but in vain, as the film cracked. The surface of the single-crystal film was polished repeatedly and the lattice constant of the polished surface of the film was measured through X-ray diffractometry (Bond's method) after every polishing operation. From the data, obtained was the relationship between the lattice constant of the single-crystal film and the thickness of the film in its growth direction (see FIG. 3). The lattice constant was obtained from the diffraction line on the face (888). As a result, the lattice constant of the single-crystal film formed on the substrate having a lattice constant of 12.495 Å was nearly the same as that of the substrate, 12.495 Å, at every depth of the film having a thickness of 500 μm, as in FIG. 3 When the film formed in the process as herein was worked into Faraday rotators, the production yield was 0%.

Comparative Example 2

6.747 g of Yb$_2$O$_3$, 6.624 g of Gd$_2$O$_3$, 43.214 g of B$_2$O$_3$, 144.84 g of Fe$_2$O$_3$, 1189.6 g of PbO, 826.4 g of Bi$_2$O$_3$, and 2.360 g of GeO$_2$ were metered and put into a Pt crucible, melted and homogenized therein with stirring at about 1000° C., and then cooled at a cooling rate of 120° C./hr. Being supersaturated, the resulting melt was stabilized at 820° C. With a CaMgZr-substituted GGG single-crystal substrate of 2 inches φ in size (thickness: 1000 μm) being rotated at 100 rpm, a magnetic garnet single-crystal film of the melt was grown in a mode of epitaxial growth on one surface of the substrate for 35 hours, while being cooled at a cooling rate of 0.30° C./hr.

As a result, the single-crystal film thus formed on the substrate had a thickness of 510 μm. On the surface of the magnetic garnet single-crystal film, no cracks were found; but many linear cracks were found in the film-substrate interface. The single-crystal film around the substrate-film interface was analyzed through fluorescent X-ray spectrometry, and its composition was Bi$_{1.12}$Gd$_{1.15}$Yb$_{0.69}$Pb$_{0.04}$Fe$_{4.96}$Pt$_{0.01}$Ge$_{0.03}$O$_{12}$.

The magnetic garnet single-crystal film was polished and worked to have a Faraday rotation angle of 45 degrees to a ray having a wavelength of 1.55 μm, and its both surfaces were coated with a non-reflective film to finish a Faraday rotator for a wavelength of 1.55 μm. The Faraday rotator was cut to have a size of 3 mm×3 mm, and was evaluated for its Faraday rotation power, insertion loss, temperature dependency and quenching coefficient. The single-crystal film thickness of the Faraday rotator was 400 μm; the Faraday rotation coefficient thereof was 0.113 deg/μm; the insertion loss thereof was at most 0.05 dB and at least 0.01 dB; the temperature dependency thereof was 0.067 deg/° C.; and the quenching coefficient thereof was at most 45.1 dB and at least 42.0 dB.

The surface of the single-crystal film was polished repeatedly and the lattice constant of the polished surface of the film was measured through X-ray diffractometry (Bond's method) after every polishing operation. From the data, obtained was the relationship between the lattice constant of the single-crystal film and the thickness of the film in its growth direction (see FIG. 4). The lattice constant was obtained from the diffraction line on the face (888). As a result, the lattice constant of the single-crystal film formed on the substrate having a lattice constant of 12.496 Å was 12.495 Å at every depth of the film having a thickness of 510 μm, as in FIG. 4. When the film formed in the process as herein was worked into Faraday rotators, the production yield was about 25%.

Comparative Example 3

6.747 g of $Yb_2O_3$, 6.624 g of $Gd_2O_3$, 43.214 g of $B_2O_3$, 144.84 g of $Fe_2O_3$, 1189.6 g of PbO, 826.4 g of $Bi_2O_3$, and 2.360 g of $GeO_2$ were metered and put into a Pt crucible, melted and homogenized therein with stirring at about 1000° C., and then cooled at a cooling rate of 120° C./hr. Being supersaturated, the resulting melt was stabilized at 820° C. With a CaMgZr-substituted GGG single-crystal substrate of 2 inches φ in size (thickness: 500 μm) being rotated at 100 rpm, a magnetic garnet single-crystal film of the melt was grown in a mode of epitaxial growth on one surface of the substrate for 33 hours, while being cooled at a cooling rate of 0.80° C./hr.

As a result, the single-crystal film thus formed on the substrate had a thickness of 500 μm. The magnetic garnet single-crystal film had a mirror surface with no cracks found thereon. The single-crystal film around the substrate-film interface was analyzed through fluorescent X-ray spectrometry, and its composition was $Bi_{1.12}Gd_{1.15}Yb_{0.69}Pb_{0.04}Fe_{4.96}Pt_{0.01}Ge_{0.03}O_{12}$.

Working the magnetic garnet single-crystal film into rotators having a Faraday rotation angle of 45 degrees to a ray having a wavelength of 1.55 μm was tried, but the film cracked when it was cut. The worked but cracked sample was coated with a non-reflective film to finish a Faraday rotator for a wavelength of 1.55 μm. The Faraday rotator was cut to have a size of 3 mm×3 mm, and was evaluated for its Faraday rotation power, insertion loss, temperature dependency and quenching coefficient. The single-crystal film thickness of the Faraday rotator was 400 μm; the Faraday rotation coefficient thereof was 0.113 deg/μm; the insertion loss thereof was at most 0.05 dB and at least 0.02 dB; the temperature dependency thereof was 0.067 deg/° C.; and the quenching coefficient thereof was at most 45.5 dB and at least 41.7 dB.

The surface of the single-crystal film was polished repeatedly and the lattice constant of the polished surface of the film was measured through X-ray diffractometry (Bond's method) after every polishing operation. From the data, obtained was the relationship between the lattice constant of the single-crystal film and the thickness of the film in its growth direction (see FIG. 5). The lattice constant was obtained from the diffraction line on the face (888). As a result, on the substrate having a lattice constant of 12.495 Å, the single-crystal film formed kept having a lattice constant of 12.494 Å before its thickness reached 10 μm, and then its lattice constant increased with the increase in the film thickness; and when its thickness reached 500 μm, the film had a lattice constant of 12.510 Å, as in FIG. 5. When the film formed in the process as herein was worked into Faraday rotators, the production yield was about 35%.

As described in detail hereinabove with reference to its embodiments, the Bi-substituted rare earth-iron garnet single-crystal film growing in a mode of liquid-phase epitaxial growth according to the invention is prevented from cracking while it grows and while the grown film is cooled or is polished and worked. Therefore, in the invention, the yield in working the single-crystal film into Faraday rotators is high.

What is claimed is:

1. A magnetic garnet single-crystal film, comprising:

a substrate and a magnetic garnet single-crystal grown on said substrate, wherein said crystal has a lattice constant that either remains constant or gradually decreases, and then increases, in a direction in which said film was grown on said substrate.

2. A method for producing a magnetic garnet single-crystal film by growing a Bi-substituted magnetic garnet single crystal in a mode of liquid-phase epitaxial growth, comprising the steps of:

controlling a lattice constant of the growing magnetic garnet single crystal so that the lattice constant remains constant or gradually decreases with the growth of the single-crystal film for a period of time from a start of the liquid-phase epitaxial growth of the film, and then controlling the lattice constant of the growing magnetic garnet single crystal so that the lattice constant increases with the growth of the single-crystal film in a direction in which said film has grown.

3. A Faraday rotator produced by working a magnetic garnet single crystal film formed in a mode of liquid-phase epitaxial growth, comprising:

a lattice constant A of a light-receiving surface of the magnetic garnet single-crystal film;

a lattice constant B of a light-emitting surface of the magnetic garnet single-crystal film; and a lattice constant C of a region of the magnetic garnet single-crystal film spaced nearly equidistant from the light-receiving surface and from the light emitting surface;

wherein the lattice constants A, B and C satisfy the requirement, (A+B)/2>C.

4. A method for producing a magnetic garnet single-crystal film, said method comprising:

growing said film on a CaMgZr-substituted GGG single-crystal substrate having a thickness of t, controlling said growth of said film such that a lattice constant of said film either is the same as a lattice constant of said substrate at room temperature or gradually decreases, within a period of time after said film has started to grow and before a thickness of said film is about t/2, and controlling said growth of said film such that said lattice constant of said film increases with an increase in said thickness of said film, in the direction in which said film has grown, after said thickness of said film is at least about t/2.

5. A method for producing a magnetic garnet single-crystal film by growing a Bi-substituted magnetic garnet single crystal on a substrate, said method comprising:

controlling a lattice constant of said film to be constant or gradually decreasing while a thickness of said film is smaller than about half of a thickness of said substrate, and controlling said lattice constant of said film to be increasing after said thickness of said film has reached at least about half of said thickness of said substrate.

6. A magnetic garnet single-crystal film produced by the method of claim 2.

* * * * *